(12) United States Patent
Jongman et al.

(10) Patent No.: US 11,996,414 B2
(45) Date of Patent: May 28, 2024

(54) SEMICONDUCTOR DEVICES

(71) Applicant: Flexenable Technology Limited, Cambridge (GB)

(72) Inventors: Jan Jongman, Cambridge (GB); Joffrey Dury, Cambridge (GB); Shane Norval, Cambridge (GB)

(73) Assignee: Flexenable Technology Limited, Cambridge (GB)

( * ) Notice: Subject to any disclaimer, the term of this patent is extended or adjusted under 35 U.S.C. 154(b) by 292 days.

(21) Appl. No.: 17/123,782

(22) Filed: Dec. 16, 2020

(65) Prior Publication Data
US 2021/0183907 A1 Jun. 17, 2021

(30) Foreign Application Priority Data
Dec. 17, 2019 (GB) ..................................... 1918626

(51) Int. Cl.
*H01L 27/12* (2006.01)
*H10K 10/46* (2023.01)
(Continued)

(52) U.S. Cl.
CPC ....... *H01L 27/1237* (2013.01); *H10K 10/464* (2023.02); *H10K 10/82* (2023.02);
(Continued)

(58) Field of Classification Search
CPC .............. H01L 27/1237; H01L 27/283; H01L 51/0014; H01L 51/0023; H01L 51/0541;
(Continued)

(56) References Cited

U.S. PATENT DOCUMENTS 6,608,658 B1 * 8/2003 Tsujimura ......... H01L 29/78633
349/110
7,782,416 B2 * 8/2010 Seo ........................ H10K 19/10
438/161
(Continued)

FOREIGN PATENT DOCUMENTS

| KR | 1020060108945 A | 10/2006 | |
|---|---|---|---|
| KR | 101380225 A | 4/2014 | |
| WO | WO-2018178657 A1 * | 10/2018 | ....... H01L 21/02266 |

OTHER PUBLICATIONS

Search Report from Great Britain Patent Application No. 1918626. 1, dated Jun. 12, 2020.
(Continued)

*Primary Examiner* — Bitew A Dinke
(74) *Attorney, Agent, or Firm* — Dergosits & Noah LLP; Todd A. Noah

(57) ABSTRACT

A device comprising a stack of layers defining one or more electronic elements, wherein the stack comprises at least: one or more semiconductor channels; a dielectric; a first conductor pattern defining one or more coupling conductors, wherein the one or more coupling conductors are capacitively coupled to the one or one or more semiconductor channels via the dielectric; a planarisation layer; a second conductor pattern defining one or more routing conductors, wherein the second conductor pattern is in contact with the first conductor pattern via through holes in at least the planarisation layer, and wherein the semiconductor channel regions are at least partly outside the through hole regions.

15 Claims, 6 Drawing Sheets

(51) Int. Cl.
   *H10K 10/82*   (2023.01)
   *H10K 19/10*   (2023.01)
   *H10K 71/00*   (2023.01)
   *H10K 71/20*   (2023.01)
(52) U.S. Cl.
   CPC ............. *H10K 19/10* (2023.02); *H10K 71/20* (2023.02); *H10K 71/621* (2023.02)
(58) Field of Classification Search
   CPC ............... H01L 51/102; H01L 51/0021; H01L 27/1244; H01L 27/1222; H01L 27/1248; H01L 27/1259; H01L 27/127; H01L 21/0274; H01L 51/0018
   See application file for complete search history.

(56) References Cited

U.S. PATENT DOCUMENTS

| | | | |
|---|---|---|---|
| 7,800,104 B2 | 9/2010 | Choi et al. | |
| 8,377,735 B2 * | 2/2013 | Kim | G02F 1/167 438/82 |
| 9,419,143 B2 * | 8/2016 | Hanaoka | H01L 21/0262 |
| 2007/0034954 A1 * | 2/2007 | Cho | H01L 27/12 257/E27.111 |
| 2007/0052025 A1 * | 3/2007 | Yabuta | H01L 29/7869 438/479 |
| 2007/0249122 A1 * | 10/2007 | Seo | H01L 51/0017 438/264 |
| 2007/0278490 A1 * | 12/2007 | Hirao | H01L 29/7869 257/64 |
| 2007/0290229 A1 * | 12/2007 | Choi | G02F 1/13624 257/192 |
| 2008/0049158 A1 * | 2/2008 | Choi | H10K 19/10 438/30 |
| 2008/0067508 A1 * | 3/2008 | Endo | H01L 21/265 257/E21.462 |
| 2009/0184314 A1 * | 7/2009 | Aoki | H10K 10/481 257/66 |
| 2010/0006826 A1 * | 1/2010 | Dimmler | H01L 51/0533 257/40 |
| 2010/0051922 A1 * | 3/2010 | Hotta | H01L 51/0541 438/151 |
| 2010/0127249 A1 | 5/2010 | Kim et al. | |
| 2011/0006290 A1 * | 1/2011 | Noh | H01L 27/3274 438/34 |
| 2011/0113859 A1 * | 5/2011 | Anthopoulos | H01L 29/66969 257/E21.409 |
| 2012/0161122 A1 * | 6/2012 | Yamazaki | H01L 29/7869 257/43 |
| 2012/0298972 A1 * | 11/2012 | Zhang | H01L 51/0541 257/40 |
| 2013/0001533 A1 | 1/2013 | Kim et al. | |
| 2013/0069055 A1 * | 3/2013 | Yamazaki | H01L 29/78693 257/43 |
| 2014/0011297 A1 * | 1/2014 | Yoon | H01L 29/6684 438/3 |
| 2015/0123121 A1 * | 5/2015 | Hanaoka | H01L 21/0262 257/43 |
| 2017/0104033 A1 * | 4/2017 | Su | H10K 71/231 |
| 2019/0181271 A1 * | 6/2019 | Zhang | H01L 27/1218 |
| 2019/0267402 A1 * | 8/2019 | Zhang | H01L 29/42384 |
| 2020/0035720 A1 * | 1/2020 | Price | H01L 29/41733 |
| 2020/0402898 A1 * | 12/2020 | Jongman | H01L 51/052 |
| 2021/0183899 A1 * | 6/2021 | Imai | H01L 27/127 |

OTHER PUBLICATIONS

Examination Report from Great Britain Patent Application No. 1918626.1, dated Jan. 19, 2024.
Examination Report from Great Britain Patent Application No. 2019934.5, dated Jan. 17, 2024.

* cited by examiner

SEMICONDUCTOR DEVICES

CLAIM OF PRIORITY

This application claims priority to Great Britain Patent Application No. 1918626.1, dated Dec. 17, 2019.

FIELD OF THE INVENTION

Semiconductor devices may comprise a stack of layers defining at least two conductor patterns at two levels of the stack, and one or more semiconductor channels each in electrical series between parts of one of the conductor patterns, and each capacitively coupled to a conductor of the other conductor pattern.

Conventionally, an insulator layer or stack of insulator layers both provides the coupling dielectric and protects the lower conductor pattern during the process of creating the upper conductor pattern.

The inventor for the present application has invented a technique aimed at facilitating an improvement in the performance and/or stability of such semiconductor devices.

There is hereby provided a device comprising a stack of layers defining one or more electronic elements, wherein the stack comprises at least: one or more semiconductor channels; a dielectric; a first conductor pattern defining one or more coupling conductors, wherein the one or more coupling conductors are capacitively coupled to the one or one or more semiconductor channels via the dielectric; a planarisation layer; a second conductor pattern defining one or more routing conductors, wherein the second conductor pattern is in contact with the first conductor pattern via through holes in at least the planarisation layer, and wherein the semiconductor channel regions are at least partly outside the through hole regions.

According to one embodiment, the through holes are wholly outside the semiconductor channel regions.

According to one embodiment, the stack comprises a third conductor pattern including conductor elements connected in electrical series via the semiconductor channels; and wherein the through holes are in one or more regions unoccupied by any conductor element of the third conductor pattern.

According to one embodiment, the second conductor pattern comprises a metal pattern, and the first conductor pattern comprises a conductive metal oxide pattern.

According to one embodiment, the stack comprises a third conductor pattern below the dielectric and a patterned semiconductor layer defining the one or more semiconductor channels; wherein the patterned semiconductor layer and the dielectric overlap parts of the third conductor pattern; and wherein the first and third conductor patterns are configured such that the first and third conductor patterns do not overlap.

According to one embodiment, the third conductor pattern is formed over parts of a fourth conductor pattern, wherein parts of the fourth conductor pattern uncovered by the third conductor pattern define electrodes connected by the one or more semiconductor channels.

There is also hereby provided a method, comprising: forming at least a semiconductor, a dielectric, and a first conductor pattern on the support substrate, wherein the semiconductor defines one or more semiconductor channels capacitively coupled via the dielectric to one or more coupling conductors of the first conductor pattern; forming a planarisation layer on the support substrate; forming through holes in at least the planarisation layer, wherein the semiconductor channels are in regions at least partly outside the through hole regions; and forming a routing conductor layer on the support substrate, and etching the routing conductor layer to define a second, routing conductor pattern in contact with the first conductor pattern via the one or more through holes.

According to one embodiment, the method further comprises: forming a third conductor pattern at least before forming the dielectric, wherein the third conductor pattern comprises conductor elements in electrical series via the semiconductor channels; and wherein the etching comprises removing portions of the routing conductor layer in one or more regions occupied by the third conductor pattern.

According to one embodiment, the through hole regions are wholly outside the semiconductor channel regions.

According to one embodiment, the semiconductor and dielectric comprise semiconductor and dielectric patterns both substantially matching and coincident with the second conductor pattern, and the one or more through holes are in one or more regions unoccupied by any conductor element of the third conductor pattern.

According to one embodiment, forming the semiconductor, dielectric and first conductor pattern comprises forming semiconductor, dielectric and coupling conductor layers on the support substrate; patterning the coupling conductor layer to form the coupling conductor pattern, and patterning the semiconductor and dielectric layers using the coupling conductor pattern and/or a mask used to form the first, coupling conductor pattern.

According to one embodiment, the second, routing conductor pattern comprises a metal pattern, and the first, coupling conductor pattern comprises a conductive metal oxide pattern.

According to one embodiment, the method further comprises forming a third conductor pattern before forming the semiconductor; wherein the semiconductor and the dielectric overlap parts of the third conductor pattern; and wherein the first and third conductor patterns are configured such that the first and third conductor patterns do not overlap.

According to one embodiment, the third conductor pattern is formed over at least some regions of a fourth conductor pattern, wherein parts of the fourth conductor pattern uncovered by the third conductor pattern define electrodes connected by the one or more semiconductor channels.

There is also hereby provided a device comprising a stack of layers defining one or more electronic elements, wherein the stack comprises at least: a patterned semiconductor layer defining one or more semiconductor channels; a patterned dielectric; a first conductor pattern defining one or more coupling conductors, wherein the one or more coupling conductors are capacitively coupled to the one or one or more semiconductor channels via the patterned dielectric; a planarisation layer; a second conductor pattern defining one or more routing conductors, wherein the second conductor pattern is in contact with the first conductor pattern via through holes in at least the planarisation layer; and wherein the first conductor pattern is configured not to overlap with a third conductor pattern below the patterned semiconductor layer in the stack, wherein the patterned semiconductor layer and patterned dielectric overlap with parts of the third conductor pattern.

According to one embodiment, the third conductor pattern is formed over parts of a fourth conductor pattern, wherein parts of the fourth conductor pattern uncovered by the third conductor pattern define electrodes connected by the one or more semiconductor channels.

There is also hereby provided a method, comprising: forming at least a semiconductor pattern, a dielectric pattern, and a first conductor pattern on the support substrate, wherein the semiconductor pattern defines one or more semiconductor channels capacitively coupled via the dielectric to one or more coupling conductors of the first conductor pattern; forming a planarisation layer on the support substrate; forming through holes in at least the planarisation layer; and forming a routing conductor layer on the support substrate, and patterning the routing conductor layer to define a second, routing conductor pattern in contact with the first conductor pattern via the one or more through holes; wherein the first conductor pattern is configured not to overlap with a third conductor pattern formed before the semiconductor pattern; wherein the semiconductor pattern and the dielectric pattern overlap with the third conductor pattern.

According to one embodiment, the third conductor pattern is formed over parts of a fourth conductor pattern, wherein parts of the fourth conductor pattern uncovered by the third conductor pattern define electrodes connected by the one or more semiconductor channels.

BRIEF DESCRIPTION OF THE FIGURES

Embodiments of the invention are described in detail hereunder, by way of example only, with reference to the accompanying drawings, in which.

In one example embodiment, the technique is used for the production of an organic liquid crystal display (OLCD) device, which comprises an organic transistor device (such as an organic thin film transistor (OTFT) device) for the control component. OTFTs comprise an organic semiconductor (such as e.g., an organic polymer or small-molecule semiconductor) for the semiconductor channels.

The terms "row" and "column" are used below to indicate a substantially orthogonal pair of directions, without indicating any absolute direction.

An embodiment of a technique according to an embodiment of the present invention is described in detail below for the example of a thin-film-transistor (TFT) array for the control component of a fringe field switching (FFS) liquid crystal device, but the technique is also applicable, for example, to TFT arrays for any kind of semiconductor device, including e.g., the control component for other types of liquid crystal display devices (LCDs); the control component for other kinds of display devices such as electrophoretic display devices (EPDs) and organic light-emitting diode (OLED) display devices; electrical circuitry for sensor devices; and electrical circuitry for logic devices.

Figure 11:
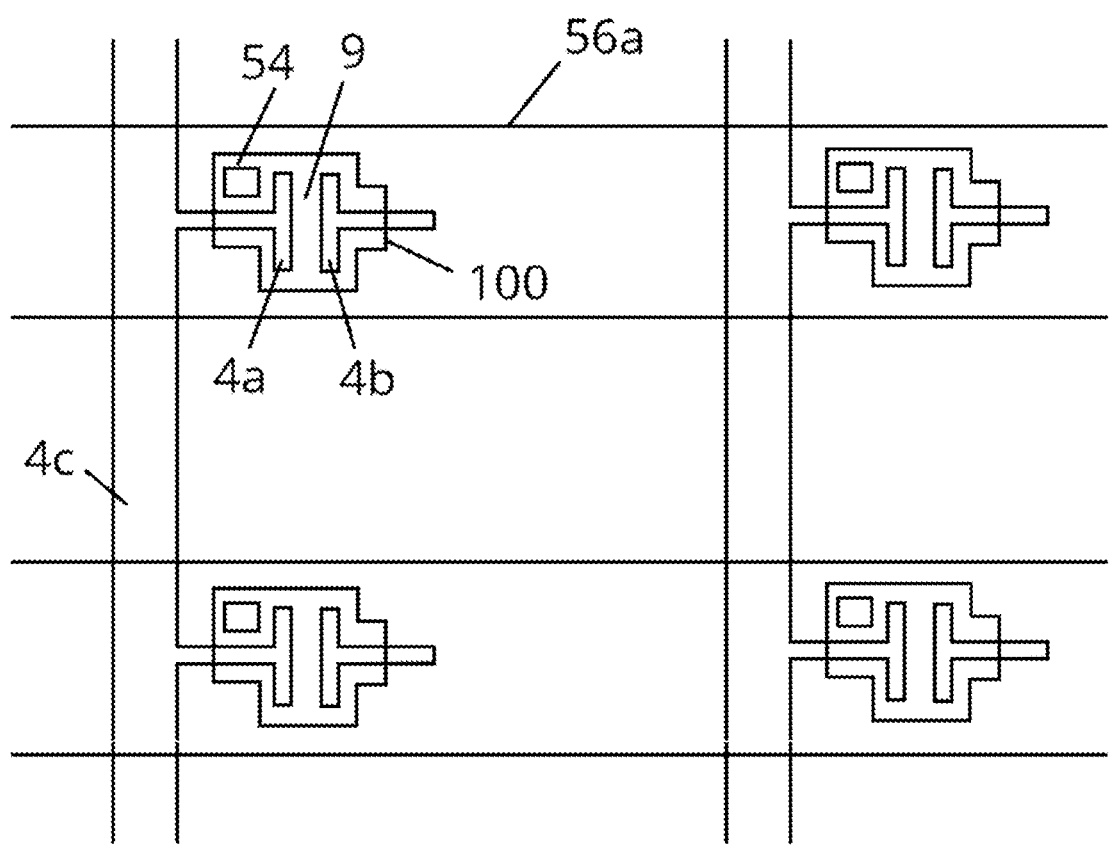
FIG. 11 is a schematic plan illustration showing positional relationships between elements shown in FIGS. 1-6 and FIGS. 7-10.

For simplicity of explanation, FIGS. 1-10 show only two semiconductor channels and FIG. 11 shows only four semiconductor channels, but a semiconductor device may comprise a very large number of semiconductor channels.

Figure 1:
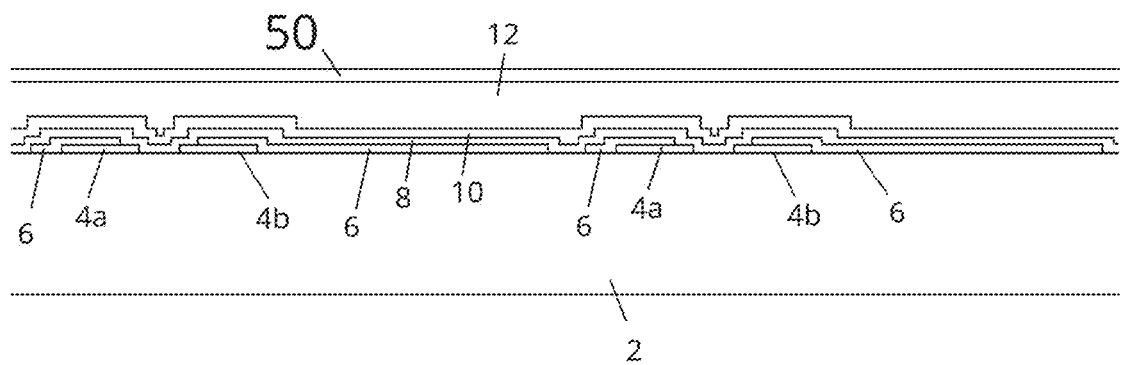
FIGS. 1-6 are schematic cross-sectional illustrations of an example of a technique according to an embodiment of the invention.

With reference to FIG. 1, the description of a technique according to a first example embodiment of the present invention begins at the stage of a workpiece comprising a planarised plastics film component 2 supporting: a lower metal pattern 4a, 4b, 4c; a transparent conductor pattern 6; a continuous semiconductor layer 8; a continuous first gate dielectric layer 10 interfacing the semiconductor layer 8; a continuous second gate dielectric layer 12; and a continuous conductive metal oxide layer 50.

In this example, the plastics film component 2 comprises an ultra-thin plastics support film (such as a 40-micron or 60-micron thickness cellulose triacetate (TAC) film, and may also be supporting one or more functional elements such as a patterned metal layer configured to shield the semiconductor channels against light incident on the rear surface of the plastics film component 2.

In this example, the lower metal pattern defines at least (i) an array of source conductors each providing the source electrodes 4a for a respective column of TFTs, and each comprising a conductor line 4c extending outside the array of TFTs; and (ii) an array of drain conductors 4b each associated with a respective pixel electrode (discussed below). Here, the term "source conductor" refers to a conductor in electrical series between the semiconductor channel and driver chip/circuitry (not shown), and the term "drain conductor" refers to a conductor in electrical series with the driver chip/circuitry via the semiconductor channel. The lower metal pattern may also define gate terminals and routing conductors via which the gate lines at a higher level are connected to the gate terminals.

In this example, the lower metal pattern 4a, 4b, 4c comprises silver (Ag). The lower metal pattern may comprise e.g., a non-noble metal even less resistant to oxidation and corrosion than silver, or may comprise a noble metal more resistant to oxidation and corrosion than silver.

The transparent conductor pattern 6 is more transparent than the lower metal pattern 4a, 4b, 4c at least in the visible part of the electromagnetic spectrum. In this example, the transparent conductor pattern 6 comprises conductive indium-tin-oxide (ITO). The ITO pattern 6 defines pixel electrodes each contacting a respective drain conductor 4b. The ITO pattern 6 also comprises ITO on at least the whole area of the conductor lines 4c defined by the lower metal pattern (but not on the parts of the source and drain conductors in closest proximity to each other). In this example, retaining ITO on the silver conductor lines 4c serves to protect the silver conductor lines 4c during subsequent processing steps (e.g., the ITO functions as a good etch-stop during the below-mentioned dry-etching of organic layers in regions over the conductor lines 4c). For other examples of devices (such as e.g., EPD, OLED display, sensor and logic devices, and some other types of LCD devices) in which a highly transmissive (highly transparent) pixel electrode is not required at the same level as the source and drain conductors: then (a) the ITO pattern 6 may be limited to regions in which the ITO may be required or desirable as a good etch-stop during subsequent patterning steps, or (b) the ITO pattern may be omitted completely, if the lower metal pattern 4a, 4b, 4c itself exhibits the required etch-stop functionality. A gold (Au) metal pattern is an example of a lower metal pattern that is resistant to dry etching processes that can be used to pattern overlying organic layers.

In this example, the semiconductor layer 8 comprises an organic conjugated polymer semiconductor, and the semiconductor layer 8 is formed by e.g., spin-coating a solution of the semiconductor polymer material. The semiconductor layer 8 defines semiconductor channels in electrical series between each drain conductor 4b and the part of the source conductor 4a in closest proximity to that drain conductor 4b. The regions of the semiconductor 8 in which the source and drain conductors are in closest proximity are hereafter referred to as the channel regions 9. One or more layers (such as a self-assembled monolayer of an organic material) may be formed selectively on exposed surfaces of the lower metal pattern 4a, 4b to facilitate the transfer of charge carriers between the source-drain conductors 4a, 4b and the semiconductor 8.

In this example, the gate dielectric comprises a stack of two dielectric layers 10, 12, but the gate dielectric may alternatively comprise only one dielectric layer, or a stack of more than two dielectric layers.

In this example, the interface gate dielectric layer 10 and uppermost gate dielectric layer 12 also comprise respective polymers, and are each formed by e.g., spin-coating a solution of the respective dielectric polymer. The uppermost gate dielectric polymer 12 material has a higher dielectric constant than the interface gate dielectric polymer 10, but the interface gate dielectric polymer 10 is better suited than the uppermost gate dielectric polymer 12 to forming a good interface with the semiconductor 8. In this example, the uppermost gate dielectric polymer 12 is formed from a cross-linkable dielectric polymer available from the Merck group under the product name Lisicon® AP048, but the uppermost gate dielectric polymer 12 may also be formed from a non-cross-linkable polymer.

In this example, the continuous conductive metal oxide layer 50 over the uppermost gate dielectric layer 12 comprises indium-tin-oxide (ITO). Other examples of conductive metal oxides may also be used, such as e.g., TiOx. A resistivity of less than about 104 Ohm/square is preferred for the conductive metal oxide layer. In this example, ITO and other conductive metal oxides can provide good etch-stop functionality in the dry-etching patterning process (discussed below) to produce through holes in overlying organic layer(s). ITO is a conductive material exhibiting a high white-light transmittance, but less transmissive (more opaque) conductive materials may also be used. Gold (Au) metal is another example of a conductor material that has good electrical conductivity and provides good etch-stop functionality in dry etching patterning processes for patterning organic layers. If the conductive layer 50 need not also provide good etch-stop functionality in the patterning process (discussed below) to produce through holes in overlying layer(s), another example option is to instead use an organic material which has the necessary level of conductivity and does not negatively affect the semiconductor channels.

This stack of layers 8, 10, 12, 50 may comprise additional layers, such as e.g., a layer of light-absorbing material (e.g., dispersion of carbon black particles in an insulating organic polymer) between the upper gate dielectric layer 12 and the ITO layer 50 to better protect the semiconductor channels in the finished device against damage by white light.

Figure 2:
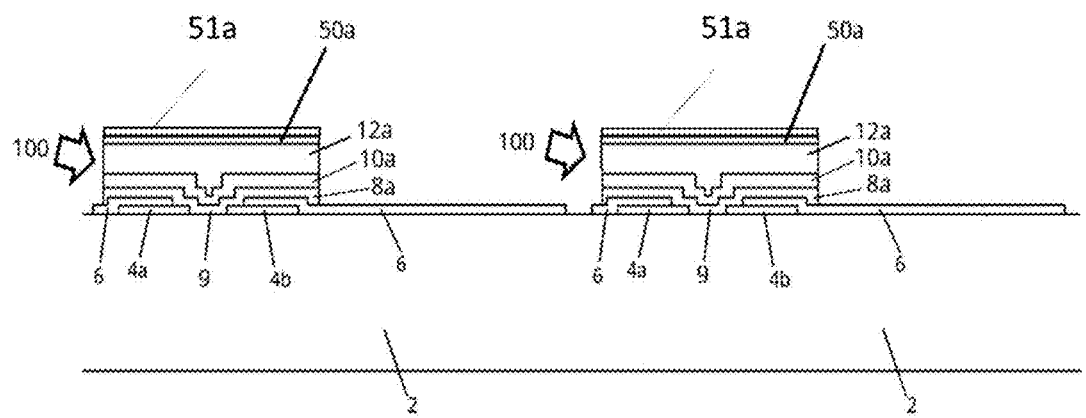

With reference to FIG. 2, the workpiece is further processed to achieve patterning of the sub-stack comprising the semiconductor layer 8, gate dielectric layers 10, 12 and metal oxide layer 50. The patterning defines isolated islands 100, each associated with a respective TFT. In this example, this patterning is done by a photolithographic technique involving: forming a photoresist layer over the metal oxide layer 50: projecting an image (positive or negative depending on the type of photoresist used) of the pattern desired for the sub-stack, using radiation that induces a change in the solubility of the photoresist, to thereby create a latent solubility pattern in the photoresist layer; developing the latent solubility pattern; using the resulting physical photoresist pattern as an etching mask 51a, wet etching the ITO layer 50 (using an etchant (e.g., an etchant comprising oxalic acid) to which at least the uppermost gate dielectric layer 12 is substantially attack-resistant and impermeable); and dry-etching the semiconductor and gate dielectric layers 8, 10, 12 using at least the ITO pattern as an etching mask. The dry etching is compatible with the choice of metal for the lower metal pattern 4a, 4b, 4c. Plasmas created from gas mixtures excluding chemically reactive gases such as oxygen etc. are compatible with a wide range of metals for the lower metal pattern 4a, 4b, 4c. More chemically reactive plasmas may only be compatible with the use of noble metals such as e.g., gold or platinum for the lower metal pattern 4a, 4b, 4c.

Figure 15:
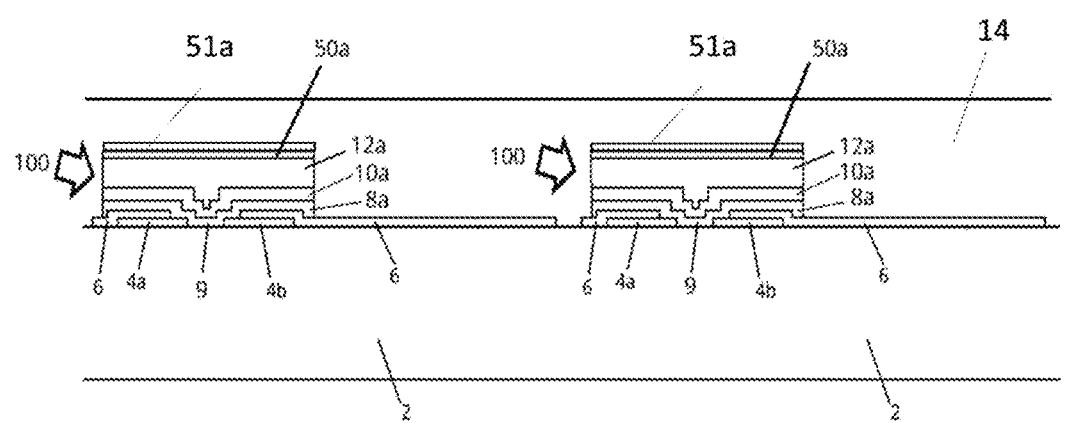
FIG. 15 illustrates another example variation of the technique of FIGS. 1-6.

In the example shown in FIGS. 1-6, none of the photoresist mask 51a is retained in the product device. In one example variation, the photoresist etching mask 51a comprises a material that fulfils a function in the product device and is retained, as shown in FIG. 15. For example: the photoresist mask 51a may comprise a mixture of a photoresist material and a light-absorbing material such as carbon black particles; and the photoresist mask is retained in the product device to provide extra white light-shielding for the semiconductor channels. In order to retain a sufficient thickness of photoresist mask in the product device, the starting thickness of the photoresist mask is calculated taking into account the amount by which the dry etching process reduces the thickness of the photoresist mask.

Figure 3:
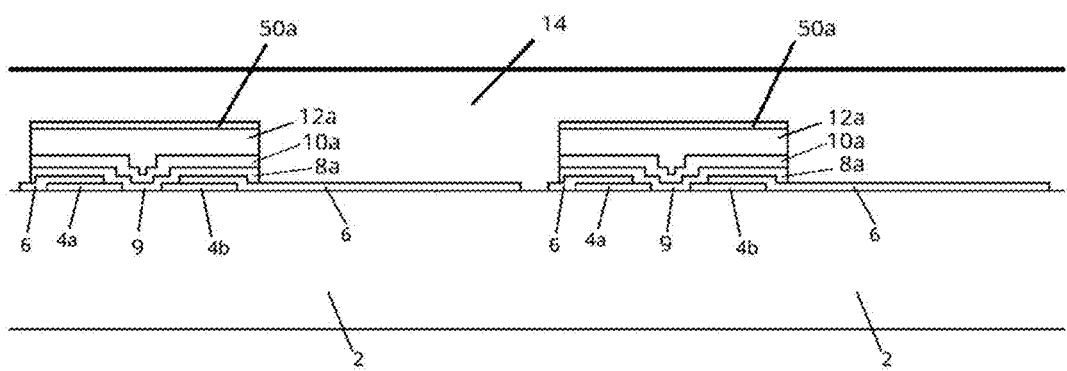

With reference to FIG. 3, the workpiece is further processed by the formation in situ on the upper surface of the workpiece of a continuous planarisation layer 14 of electrically insulating material over at least the whole area of the TFT array (including the whole area of the above-mentioned islands 100 and the whole area between the islands 100). In this example, the planarisation layer 14 is formed by a solution processing technique such as e.g., spin-coating.

Figure 4:
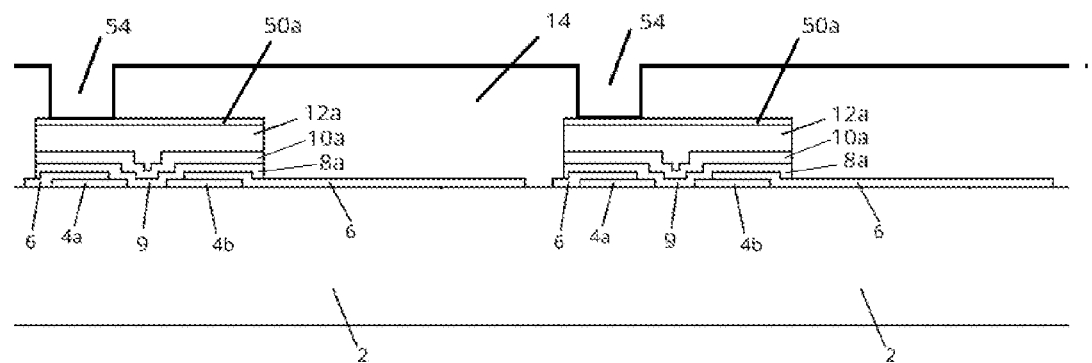

With reference to FIG. 4, the workpiece is further processed by patterning the planarisation layer 14 to define through holes 54 (interconnect vias ICVs), each through hole 54 exposing the ITO layer (of a respective island 100). In this example, each through hole 54 is formed in a region that is wholly outside the respective channel region 9 to best protect the semiconductor 8a in the channel region 9 from the process of creating the through holes 54. However, in one example variation (particularly suited to high-resolution display devices), the regions in which the through holes 54 are formed may occupy a part of the semiconductor channel regions. In both cases, for each island 100 there is at least part of the semiconductor channel region that is occupied by the patterned ITO layer 50a but not the through hole 54; and good operation of the TFT across the whole channel region thus relies on the ITO layer 50a.

The regions in which the through holes 54 are formed are also in regions in which the lower metal pattern does not define any conductor element. This feature (shown in FIG. 7) minimises the risk of shorts between the gate metal pattern (described below) and the lower metal pattern. In this example, the planarisation layer 14 comprises a cross-linkable polymer (such as an epoxy-based cross-linkable polymer, e.g., SU-8 negative photoresist available from MicroChem Corp.); and the patterning comprises: projecting a negative image of the desired through hole pattern (i.e., positive image of the pattern desired for the planarisation layer 14) onto the cross-linkable planarisation layer 14, using radiation that induces cross-linking and thereby decreases solubility of the insulating material of the planarisation layer 14, to create a latent solubility image in the planarisation layer 14; and developing the latent solubility image.

The patterning of the planarisation layer 14 may also comprise forming other through holes (not shown), such as through holes in regions outside the TFT array (active area) for the gate conductors 56a (mentioned below) to contact routing conductors defined by the lower metal pattern.

In addition to functioning as the gate electrode, the ITO layer 50a at the top of each island 100 can function as a dry-etch stop, which facilitates the alternative use of dry etching to create the through holes 54 in the planarisation layer 14. For the alternative example of using dry etching to form the through holes 54, a photoresist, etching mask is formed over the planarisation layer 14, and is removed after it has been used to pattern the planarisation layer 14. More particularly, the ITO at the top of each island 100 facilitates dry etching the full thickness of planarisation layer 14 without exposing the uppermost gate dielectric 12 to the dry-etching conditions. The use of a dry-etching technique for creating the through holes 54 in the planarisation layer 14 can provide an upper workpiece surface with a more gradual step in the border regions between inside and outside the regions of the through holes 54, and thereby better facilitate the formation of gate conductor lines 56a (discussed below) that extend without breaks over the upper surface of the workpiece.

For the alternative example of using dry etching, the planarisation layer 14 comprises the same negative photoresist material (e.g., SU-8) as in the wet-etching example, and the photoresist layer used to pattern the planarisation layer 14 comprises a positive photoresist material.

Figure 5:
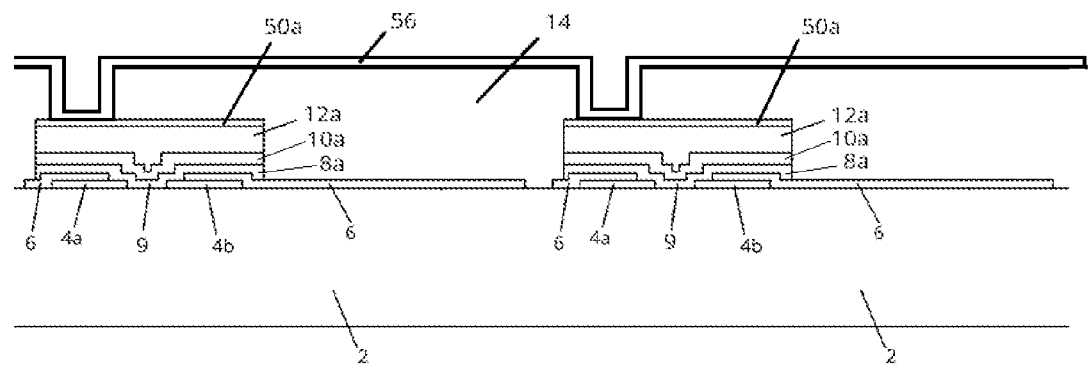

With reference to FIG. 5, the workpiece is further processed by the formation of at least one continuous metal layer 56 in situ on the upper surface of the workpiece defined together by the uppermost gate dielectric layer 12 and patterned ITO layer 50a (in the regions of the through holes 54). The at least one metal layer 56 is formed continuously over the whole area of the array of TFTs and beyond. In this example, a sub-stack of metal layers is used, comprising an aluminium (Al) layer sandwiched between two molybdenum (Mo) layers. In this example, each metal layer of this sub-stack is formed in situ on the workpiece by a vapour deposition technique such as e.g., sputtering.

Figure 6:
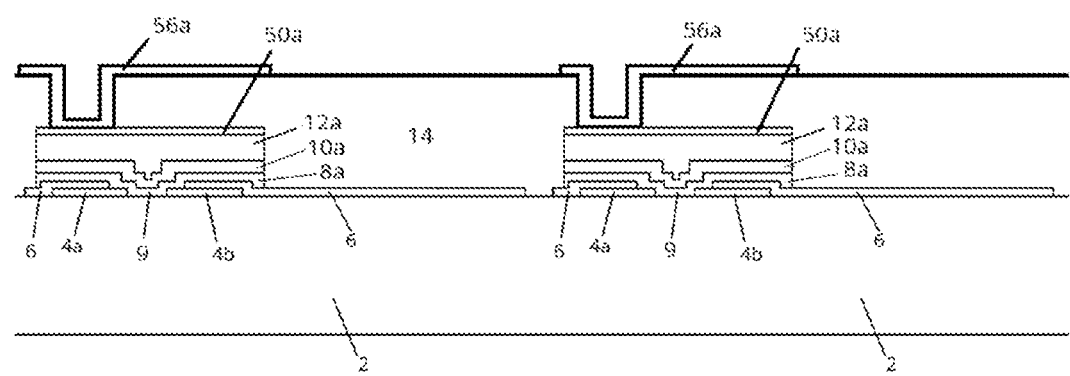
Figure 7:
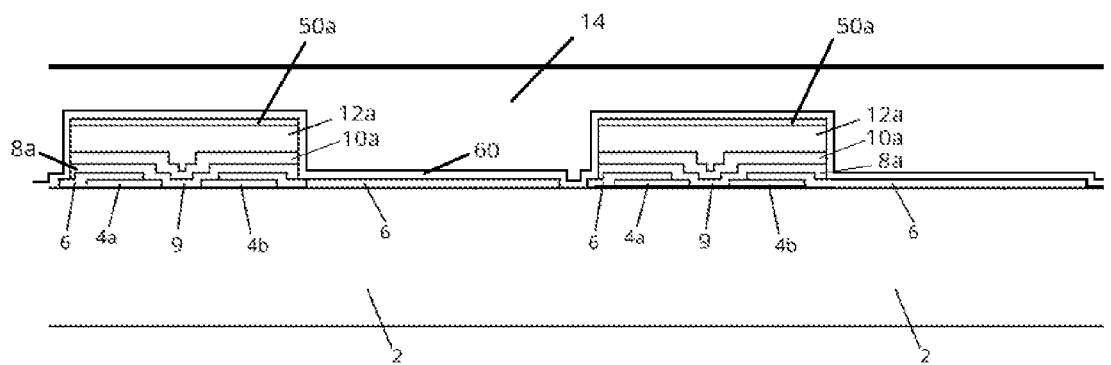
FIGS. 7-10 are schematic cross-sectional illustrations of another example of a technique according to another embodiment of the invention.
Figure 8:
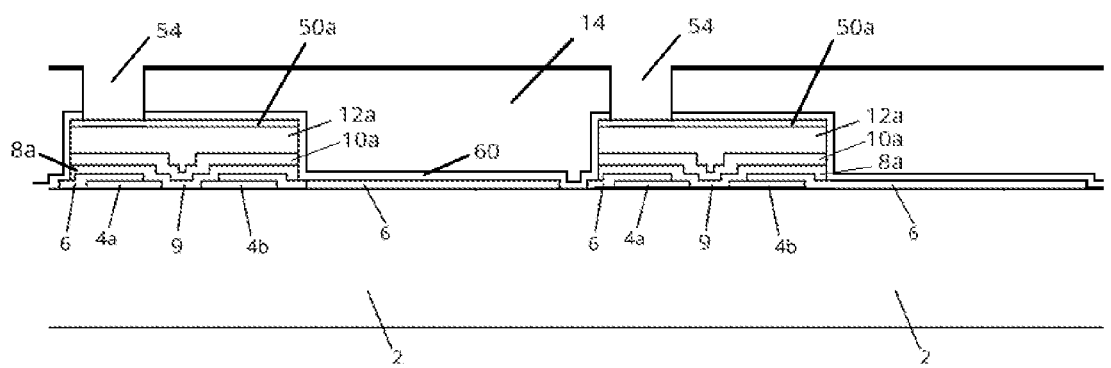
Figure 9:
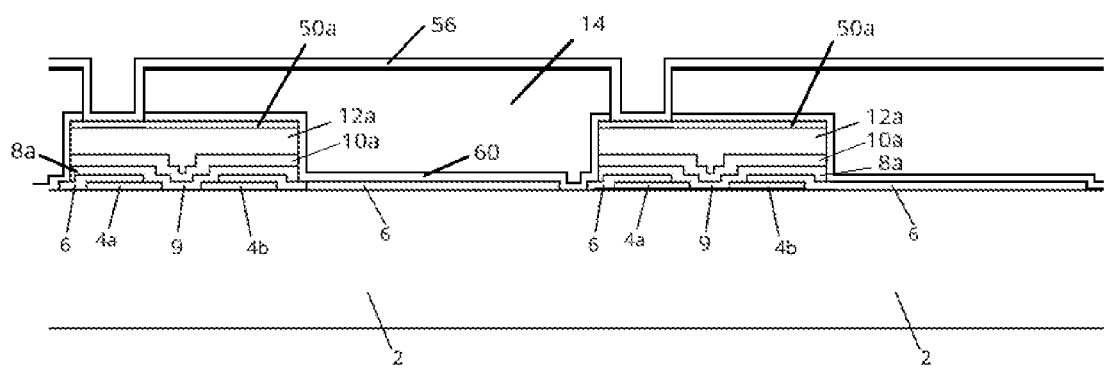
Figure 10:
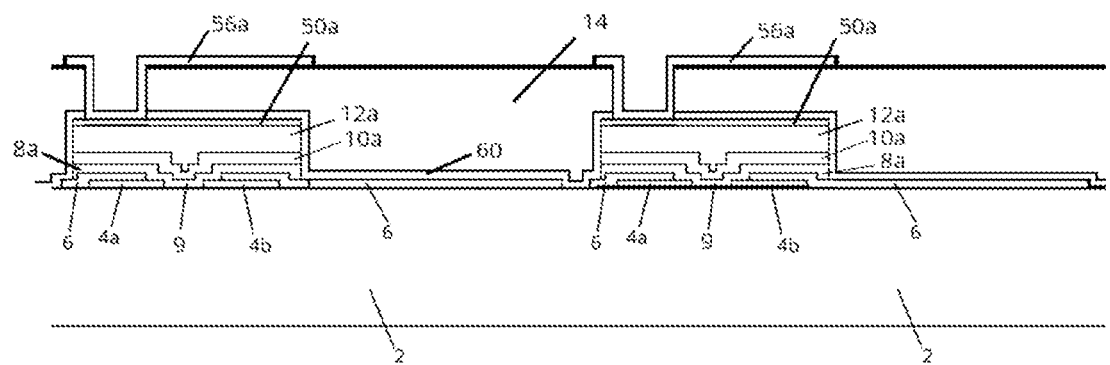

With reference to FIG. 6, the workpiece is further processed to pattern the metal sub-stack 56, to define gate conductors 56a each providing the gate electrodes for a respective row of transistors, and each extending beyond the edge of the array of TFTs. In this example, this patterning is done by a photolithographic technique comprising: forming a photoresist layer over the metal sub-stack 56; projecting onto the photoresist an image (positive or negative depending on the type of photoresist used) of the pattern desired for the gate conductors 56a, using radiation that induces a change in the solubility of the photoresist, to create a latent solubility image; developing the latent solubility image; and using the resulting physical pattern in the photoresist as an etching mask for patterning the metal sub-stack 56 using one or more patterning agents. In this example, the patterning agent is a wet metal etchant whose main component is phosphoric acid H3PO4. In this example, the planarisation layer 14 comprises a material that is less (compared to the uppermost gate dielectric material 12) susceptible to damage (surface roughening) by this wet metal etchant and/or less (compared to second gate dielectric material 12) permeable to this wet metal etchant. The regions in which the metal sub-stack 56 is removed include regions overlying conductor elements defined by the lower metal pattern (e.g., source line conductors 4c), and this relatively high attack-resistance and impermeability to the wet metal etchant better protects the underlying lower metal pattern against being etched by this wet metal etchant.

The upper surface of the planarisation layer 14 is higher than the upper surface of the uppermost gate dielectric layer 12. This relatively large thickness for the planarisation layer 14 can be advantageous for improving dielectric breakdown properties; and the relatively small thickness for the gate dielectric layer 12 can be advantageous for improving capacitance between the ITO gate electrodes 50aa and the semiconductor 8a in the channel regions 9.

The planarisation layer 14 and uppermost gate dielectric layer 12 may have different physical and/or chemical properties. For example, the two layers may differ in terms of one or more of the following properties: dielectric constant; layer thickness; etch resistance; adhesion to interfacing layers; density; dielectric breakdown strength; and purity.

In the example described above, both planarisation layer 14 and uppermost gate dielectric layer 12a are cross-linked layers in the final device; and the method by which cross-linking is achieved in the planarisation layer 14 may be different or the same as the method by which cross-linking is achieved in the uppermost gate dielectric layer 12a.

Furthermore, the planarisation layer 14 comprises a material selected for its good (compared to the uppermost gate dielectric layer 12a) adhesion to at least one or more (and preferably all) of the gate metal pattern 56a, the lower metal pattern 4a, 4b, 4c and the upper surface of the plastics film component 2 (e.g., an organic polymer planarisation layer at the upper surface of the plastics film component 2). For example, good adhesion to the gate metal pattern 56a better avoids the gate conductor lines 56a lifting off the underlying insulator surface.

Each pixel electrode is associated with a respective unique combination of source and gate conductors, whereby each pixel electrode can be independently addressed via the portions of gate and source conductors outside the array of TFTs.

Further processing (not shown in the drawings) comprises the formation on the upper surface of the workpiece (as defined by the gate conductors 56a and planarisation layer 14) of a continuous layer of transparent conductor material (e.g., ITO) in situ on the workpiece, followed by patterning of the continuous layer to define the patterned common electrodes for the FFS liquid crystal device.

A second example technique according to another embodiment of the invention is shown in FIGS. 7-10. The second example is the same as the first example FIGS. 1-6), except that an inorganic insulating passivation layer 60 (having a high white-light transmittance) is formed on the upper surface of the workpiece (over at least the whole active area) before formation of the organic planarisation layer 14. The inorganic insulating layer 60 may, for example, comprise an inorganic nitride layer, such as e.g., an aluminium nitride (AlNx) layer, an aluminium oxide (AlOx) layer or a silicon nitride (SiNx) layer. The thickness of the inorganic insulating layer may, for example, between about 40 nm and 100 nm. The inorganic insulating layer 60 may, for example, be formed by a vapour deposition technique such as e.g., sputtering, plasma-enhanced chemical vapour deposition (PECVD) and atomic layer deposition (ALD). The inorganic insulating layer 60 is patterned (FIG. 10) using the same photoresist etching mask as the planarisation layer, such that the through holes 54 extend down to the ITO layer 50a. The patterning of the inorganic insulating layer 60 may be done by dry etching or wet etching (using an etchant compatible with retention of the underlying ITO layer 50a). The inorganic insulating layer 60 acts as an extra gate dielectric layer and can improve yield and reduce the risk of dielectric breakdowns. The inorganic insulating layer 60 also provides further protection for the lower metal pattern against the etchants used to pattern the upper metal substack 56.

The variations, additions and process details mentioned for the first example are also applicable to this second example. In particular, the gate dielectric may comprise a single dielectric layer or a stack of dielectric layers.

The above-described techniques facilitate the selection for the gate dielectric (e.g., upper most gate dielectric layer in the example of using a stack of gate dielectric layers for the gate dielectric) of a dielectric material optimised for good capacitance and TFT stability, by reducing the demands on the uppermost gate dielectric layer 12 for good attack-resistance and impermeability against the gate metal etchant, and good adhesion to interfacing layers.

Figure 12:
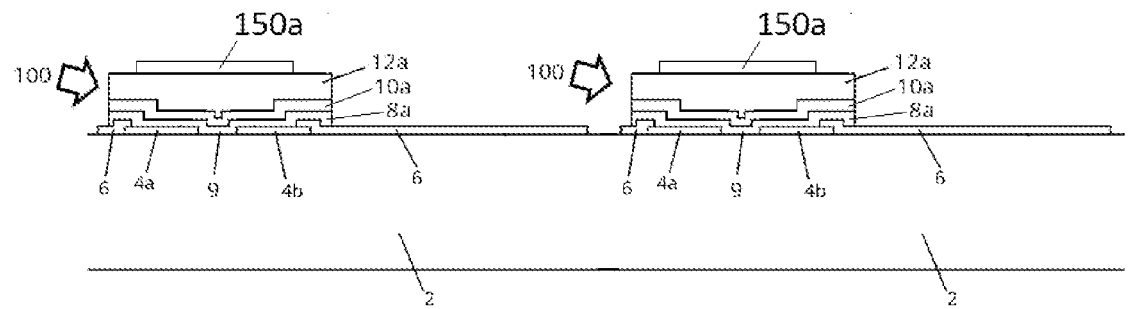
FIGS. 12-14 illustrate one example variation of the techniques of FIGS. 1-6 and FIGS. 7-10.
Figure 13:
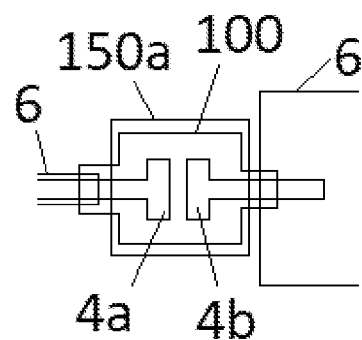
Figure 14:
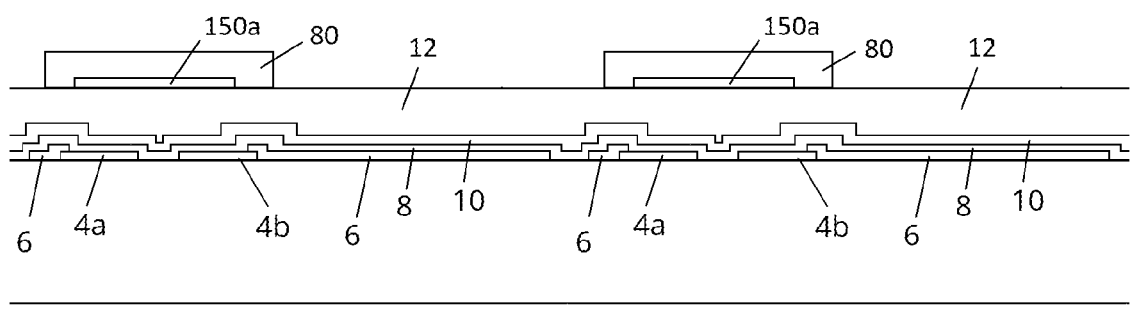

According to one example variation of the techniques described above and illustrated in FIGS. 1-10, the ITO layer 50 is patterned separately to the underlying semiconductor and dielectric layers 8, 10 and 12. Differently configured masks are used for the patterning of the ITO layer 50 and the patterning of the underlying semiconductor and dielectric layers 8, 10, 12. As shown in schematic cross-sectional FIG. 12 and schematic plan FIG. 13: the lower and upper ITO patterns 6, 150a are configured such that there is no overlap between the upper and lower ITO patterns 6, 150a; and the islands 100 of semiconductor and dielectric layers 8, 10, 12 are configured such that the islands 100 overlap with the lower ITO pattern 6. As shown in schematic cross-sectional FIG. 14, this example variation involves forming an additional photoresist mask 80 for patterning the semiconductor and dielectric layers 8, 10, 12 after patterning the ITO layer 50. This example variation can further improve yield by reducing the risks of shorts between the upper ITO pattern 150a and the lower ITO pattern 6.

According to an example variation of all the techniques described above and illustrated in FIGS. 1-14, the upper conductor pattern 50a, 150a is instead formed from a conductive material having a lower white-light transmittance, such as a layer of a metal or metal alloy, such as e.g., an alloy comprising tantalum and molybdenum (MoTa alloy). MoTa alloy is an example of a material that is also resistant to the dry etching used to pattern the underlying semiconductor and dielectric layers 8, 10, 12 into islands 100 and/or the overlying planarisation layer 14 to create through holes 54 down to the conductor pattern 50a, 150a. Depending on what technique is used to pattern the overlying planarisation layer 14, resistance to dry etching may be less important in the above-described example variation illustrated in FIGS. 12-14, in which the conductive capping layer 150a has a different pattern to that of the underlying semiconductor and dielectric layers 8, 10, 12, and is not used as a mask for patterning the underlying semiconductor and dielectric layers 8, 10, 12.

As mentioned above, an example of a technique according to the present invention has been described in detail above with reference to specific process details, but the technique is more widely applicable within the general teaching of the present application. Additionally, and in accordance with the general teaching of the present invention, a technique according to the present invention may include additional process steps not described above, and/or omit some of the process steps described above.

In addition to any modifications explicitly mentioned above, it will be evident to a person skilled in the art that various other modifications of the described embodiment may be made within the scope of the invention.

The applicant hereby discloses in isolation each individual feature described herein and any combination of two or more such features, to the extent that such features or combinations are capable of being carried out based on the present specification as a whole in the light of the common general knowledge of a person skilled in the art, irrespective of whether such features or combinations of features solve any problems disclosed herein, and without limitation to the scope of the claims. The applicant indicates that aspects of the present invention may consist of any such individual feature or combination of features.

The invention claimed is:

1. A device comprising a stack of layers defining one or more electronic elements, wherein the stack comprises at least:
    one or more semiconductor channels in one or more semiconductor channel regions;
    a dielectric;
    a first conductor pattern defining one or more coupling conductors, wherein the one or more coupling conductors are capacitively coupled to the one or one or more semiconductor channels via the dielectric;
    a planarisation layer;
    a second conductor pattern defining one or more routing conductors, wherein the second conductor pattern is in contact with the first conductor pattern via one or more through holes in at least the planarisation layer in one or more through hole regions, and wherein the one or more semiconductor channel regions are at least partly outside the one or more through hole regions; and
    wherein the device further comprises a retained photoresist mask used at least to form the first conductor pattern.

2. The device according to claim 1, wherein the one or more through holes are wholly outside the one or more semiconductor channel regions.

3. The device according to claim 1, wherein:
    the stack comprises a third conductor pattern including conductor elements connected in electrical series via the one or more semiconductor channels; and
    wherein the one or more through holes are in one or more regions unoccupied by any conductor element of the third conductor pattern.

4. The device according to claim 1, wherein the second conductor pattern comprises a metal pattern, and the first conductor pattern comprises a conductive metal oxide pattern.

5. The device according to claim 1, wherein the planarization layer includes no through holes in the one or more semiconductor channel regions.

6. The device according to claim 1, wherein the retained photoresist mask provides white-light shielding for one or more the semiconductor channels.

7. The device according to claim 1, wherein the retained photoresist mask comprises a photoresist material and carbon black particles.

8. The device according to claim 1, wherein the planarization layer comprises a gradual step in border regions between inside and outside the through-hole regions.

9. The device according to claim 1, wherein the planarization layer includes no other through holes in the one or more semiconductor channel regions.

10. A device comprising a stack of layers defining one or more electronic elements, wherein the stack comprises at least:
- a patterned semiconductor layer defining one or more semiconductor channels in one or more semiconductor channel regions;
- a patterned dielectric;
- a first conductor pattern defining one or more coupling conductors, wherein the one or more coupling conductors are capacitively coupled to the one or more semiconductor channels via the patterned dielectric;
- a planarisation layer;
- a second conductor pattern defining one or more routing conductors, wherein the second conductor pattern is in contact with the first conductor pattern via one or more through holes in at least the planarisation layer in one or more through hole regions; and
- wherein the first conductor pattern is configured not to overlap with a third conductor pattern below the patterned semiconductor layer in the stack, wherein the patterned semiconductor layer and patterned dielectric overlap with parts of the third conductor pattern; wherein the third conductor pattern is formed over parts of a fourth conductor pattern, wherein parts of the fourth conductor pattern uncovered by the third conductor pattern define electrodes connected by the one or more semiconductor channels; and the first conductor pattern overlaps the electrodes, and wherein the device further comprises a retained photoresist mask used at least to form the first conductor pattern.

11. The device according to claim 10, wherein the first conductor pattern occupies regions unoccupied by the patterned dielectric.

12. The device according to claim 10, wherein the fourth conductor pattern defines conductor lines, and wherein the third conductor pattern comprises a conductive oxide protecting the conductor lines.

13. A device comprising a stack of layers defining one or more electronic elements, wherein the stack comprises at least:
- one or more semiconductor channels in one or more semiconductor channel regions;
- a dielectric;
- a first conductor pattern defining one or more coupling conductors, wherein the one or more coupling conductors are capacitively coupled to the one or one or more semiconductor channels via the dielectric;
- a planarisation layer;
- a second conductor pattern defining one or more routing conductors, wherein the one or more routing conductors are in contact with the first conductor pattern via one or more through holes in at least the planarisation layer in one or more through hole regions, wherein the one or more semiconductor channel regions are at least partly outside the through hole regions; and
- wherein the routing conductors extend through the semiconductor channel regions; and wherein the device further comprises a retained photoresist mask used at least to form the first conductor pattern.

14. The device according to claim 13, wherein the retained photoresist mask provides white-light shielding for the one or more semiconductor channels.

15. The device according to claim 13, wherein the retained photoresist mask comprises a photoresist material and carbon black particles.

* * * * *